(12) United States Patent
Guermandi et al.

(10) Patent No.: US 9,379,798 B2
(45) Date of Patent: Jun. 28, 2016

(54) MODULATION CIRCUIT FOR A RADIO DEVICE AND A METHOD THEREOF

(71) Applicant: IMEC VZW, Leuven (BE)

(72) Inventors: Davide Guermandi, Leuven (BE); Vito Giannini, Leuven (BE); Wim Van Thillo, Mortsel (BE); André Bourdoux, Theux (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/615,541

(22) Filed: Feb. 6, 2015

(65) Prior Publication Data

US 2015/0222344 A1  Aug. 6, 2015

(30) Foreign Application Priority Data

Feb. 6, 2014  (EP) .................................... 14154137

(51) Int. Cl.
| | |
|---|---|
| *H04L 27/00* | (2006.01) |
| *H04B 7/06* | (2006.01) |
| *H04B 1/04* | (2006.01) |
| *H04L 27/20* | (2006.01) |

(Continued)

(52) U.S. Cl.
CPC .............. *H04B 7/06* (2013.01); *H03D 7/1441* (2013.01); *H03D 7/1458* (2013.01); *H03D 7/165* (2013.01); *H04B 1/0475* (2013.01); *H04B 1/0483* (2013.01); *H04L 27/2053* (2013.01); *H03D 2200/0086* (2013.01)

(58) Field of Classification Search
CPC ...... H04B 7/06; H04B 1/0483; H04B 1/0475; H04L 27/2053; H03D 7/1441; H03D 7/1458; H03D 7/165; H03D 2200/0086
See application file for complete search history.

(56) References Cited

U.S. PATENT DOCUMENTS

| | | | |
|---|---|---|---|
| 2,496,281 A | 2/1950 | Fisher | |
| 3,175,340 A | 3/1965 | Schulze | |

(Continued)

FOREIGN PATENT DOCUMENTS

| | | |
|---|---|---|
| EP | 0 070 695 A2 | 1/1983 |
| EP | 0 417 528 A2 | 3/1991 |

OTHER PUBLICATIONS

European Search Report, European Patent Application No. 15151578.0, dated Jun. 17, 2015.

(Continued)

*Primary Examiner* — Dac Ha
(74) *Attorney, Agent, or Firm* — McDonnell Boehnen Hulbert & Berghoff LLP

(57) ABSTRACT

The present disclosure relates to a modulation circuit and a method for suppressing energy content of spectral side lobes caused by high-frequency content present in a baseband signal, with the energy content of the spectral side lobes being outside an intended operational bandwidth in a modulated radio-frequency signal. An example circuit is configured to: receive a digital baseband signal, feed the digital baseband signal to a first and a second signal path, with the first signal path comprising a first mixer and the second signal path comprising a delay circuit and a second mixer. The first mixer and the second mixer may receive a same local oscillator signal, and may respectively provide a first radio-frequency signal and a second radio-frequency signal that are delayed with respect to each other. The example circuit is further configured to generate an output radio-frequency signal by combining the first and second radio-frequency signals.

19 Claims, 6 Drawing Sheets

(51) Int. Cl.
*H03D 7/14* (2006.01)
*H03D 7/16* (2006.01)

(56) References Cited

U.S. PATENT DOCUMENTS

| | | | |
|---|---|---|---|
| 3,881,895 A | 5/1975 | Wattles | |
| 5,283,048 A | 2/1994 | Martin | |
| 5,787,126 A | 7/1998 | Itoh et al. | |
| 6,721,369 B1 | 4/2004 | Hash et al. | |
| 7,632,416 B2 | 12/2009 | Levitt | |
| 7,980,395 B2 | 7/2011 | Kehl | |
| 8,155,235 B2* | 4/2012 | Fujita | H04L 27/0008 375/259 |
| 8,406,704 B2* | 3/2013 | Rofougaran | H04B 1/0483 375/296 |
| 8,929,480 B2* | 1/2015 | Fukuda | G06G 7/14 341/143 |
| 9,077,421 B1* | 7/2015 | Mehlman | H04B 1/10 |
| 2005/0068096 A1 | 3/2005 | Yoon | |
| 2006/0019622 A1 | 1/2006 | Domino et al. | |
| 2007/0153936 A1* | 7/2007 | McGowan | H03F 1/3241 375/295 |
| 2009/0093224 A1* | 4/2009 | Shi | H04B 1/0475 455/126 |
| 2010/0102010 A1 | 4/2010 | Nuckols | |
| 2012/0010063 A1 | 1/2012 | Levitt | |
| 2013/0206661 A1 | 8/2013 | Stein | |
| 2014/0269986 A1* | 9/2014 | Nagode | H04B 1/0475 375/296 |

OTHER PUBLICATIONS

Eloranta, Petri et al., "A Multimode Transmitter in 0.13 um CMOS Using Direct-Digital RF Modulator", IEEE Journal of Solid-State Circuits, vol. 42, No. 12, Dec. 2007, pp. 2774-2784.

Jerng, Albert et al., "A Wideband ΔΣ Digital -RF Modulator for High Data Rate Transmitters", IEEE Journal of Solid-State Circuits, vol. 42, No. 8, Aug. 2007, pp. 1710-1722.

Rahmatollahi, Shoeib et al., "A Simple Pre-Filtering for Spectral Smoothing in a Radio Frequency Digital to Analog Converter", 2012 IEEE International Conference on Circuits and Systems, Oct. 3-4, 2012, pp. 103-106.

Trotta, Saverio et al., "A 79GHz SiGe-Bipolar Spread-Spectrum TX for Automotive Radar", ISSCC 2007/Session 23/Broadband RF and Radar/ 23.7, 2007 IEEE International Solid-State Circuits Conference, Feb. 14, 2007, pp. 430-431 and 613.

Belkerdid, M.A. et al., "Sinusoidal SBPSK Modulation Waveform for UHF SATCOM Channels with Improved Adjacent Channel Emissions", IEEE Military Communications Conference, Orlando, Florida, USA, Oct. 29-31, 2007, pp. 1-7.

Tomkins, Alexander et al., "A Zero-IF 60 GHz 65 nm CMOS Transceiver With Direct BPSK Modulation Demonstrating up to 6 Gb/s Data Rates Over a 2 m Wireless Link", IEEE Journal of Solid-State Circuits, vol. 44, No. 8, Aug. 2009, pp. 2085-2099.

* cited by examiner

MODULATION CIRCUIT FOR A RADIO DEVICE AND A METHOD THEREOF

CROSS-REFERENCE TO RELATED APPLICATION

Priority is claimed to European Patent Application No. 14154137.5 filed Feb. 6, 2014, the contents of which are hereby incorporated by reference.

TECHNICAL FIELD

The present disclosure relates to radio devices operating at millimeter-wave frequencies and, more specifically, to a modulation circuit for such radio devices.

BACKGROUND

Signal modulation is an operation that changes some of the properties (such as amplitude, frequency, phase, or any combination thereof) of a high frequency sine wave signal, called a carrier signal, as a function of another signal, called a modulating signal. Because the carrier is commonly at a much higher frequency of the modulating signal, this operation is also called up-conversion.

The most common architecture used to modulate a signal at a high frequency (e.g. from a few MHz to tens of GHz) is the Gilbert cell mixer, that acts as a multiplier of two inputs. It essentially multiplies a modulating signal (e.g., a digital signal) applied at a first input with a carrier signal (or a local oscillator signal) applied at a second input, thereby modulating the carrier signal according to the binary data. Usually, the modulating signal is applied at a linear input which performs a voltage-to-current conversion, while the modulated signal—the carrier signal—is applied to a nonlinear input (also called switching input). Driving the mixer's non-linear input with a local oscillator signal (a very high frequency signal) requires the amplitude of the latter to be sufficiently high in order to drive the switching input under any process, voltage, and temperature (PVT) variations, and hence leads to high power consumption. For power efficient modulation, known solutions propose swapping the signals applied at the two inputs of the mixer. Applying the local oscillator signal to the linear input of the mixer allows using a local oscillator signal with a smaller amplitude, thus reducing the power consumption of the mixer.

If the modulating signal is a digital signal (i.e. a binary sequence), the modulated signal is the multiplication of the carrier signal by +1 or −1, depending on the bit sign. This type of modulation is called Binary Phase Shift Keying (BPSK). Without taking any countermeasures, the full spectrum of the digital signal, or all frequency components the digital signal consists of including its respective high-frequency components (its side lobes), are up-converted. However, the side lobes at high frequency may be not compatible with the spectral emission mask requirements, such as the ESTI specification for 79 GHz radar applications, that specify the energy requirements for the frequency components located around an intended operational bandwidth. This issue is explained in more details below.

In perfect BPSK modulation, the high-frequency carrier is multiplied by +1 or −1, depending on the modulating bit. This means the output is a sine wave with a phase of either 0 or 180 degrees (i.e. 0 or π). Such instantaneous phase jumps introduce discontinuities in the waveform of the modulated signal, which are translated in a wide-frequency spectrum with respect to the single tone of the carrier signal, as shown in FIG. 1, thereby causing side lobes to appear around the carrier tone. The first side lobe corresponds to the third harmonic, the second side lobe corresponds to the fifth harmonic, and so forth. The power (P) of the side lobes located around the main lobe (or the intended operational bandwidth) decreases according to:

$$\left(\frac{\sin(x)}{x}\right)^2, x = \pi \frac{f}{f_s} \quad (1)$$

where f is the offset frequency from the carrier on the x-axis, and $f_s$ is the sampling frequency of the baseband signal (2 GHz in FIG. 1).

Since the power of the side lobes (i.e., each side lobe's respective energy content) decreases as shown in (1), the power of a side lobe with respect to the main lobe can be computed in decibels as $$P_n = -20\log_{10}\frac{2}{\pi(2n+1)} \quad (2)$$

where n is the number of the side lobe.

From the above equation, the first and the second side lobes have a power of −13.4 dB and −17.9 dB with respect to the main lobe, respectively, and thus are not compliant with the emission specification set by the ETSI standardization bodies. By way of example, the ETSI emission specification for radar applications in the 79 GHz band allows for side lobes with a power that is 27 dB lower than the power of the main lobe, as shown in FIG. 2.

To comply with the emission mask requirements, conventional solutions opt for either reducing the peak transmitted power by an additional 13.6 dB (27 dB-13.4 dB) or filtering the side lobes.

Some known solutions propose reduction of harmonic content caused by the baseband signal by filtering the signal at the modulator output—filtering at radio frequencies (RF). But achieving a substantial suppression of the side lobes at such high frequencies requires a higher-order band-pass filter with a high quality factor (e.g., higher than the ratio of the required center frequency to required bandwidth). In radar applications where a radio should operates at 80 GHz within a 4 GHz-wide bandwidth, a second order band-pass filter (BPF) with a quality factor of at least 20 (i.e., 80 GHz/4 GHz) is required. Realizing an RF BPF with such high quality factor, good control on the center frequency, and the requisite bandwidth is practically impossible using standard CMOS technology. External filters with lumped or distributed components may be used, but this would unavoidably lead to extra cost and most likely losses. Such solutions are therefore not practical or cost-effective for applications at very high frequencies—frequencies above 5-10 GHz.

Other solutions propose reducing the side lobes by filtering the high-frequency content of the baseband signal prior to up-conversion. A baseband filter smooths the transitions of the baseband waveform from "0" to "1", leading to a smoother phase transition from 0 to 180 degrees in the waveform at the modulator output. While effective in reducing distant side lobes, baseband filtering is not effective in reducing the most critical side lobes—the ones closest to the main lobe. Higher-order baseband filters may be more effective in reducing the critical side lobes, but such filters require active components (such as transistors, transconductors, operational amplifiers) or inductors to generate complex conjugate poles for a sharper response, and thus leading to higher power consumption and circuit complexity.

Harmonic Rejection (HR) is a technique used for rejecting harmonics caused by the local oscillator signal during the mixing operation. A typical HR technique allows for suppression of the local oscillator's side lobes corresponding to (i) the third harmonic, (ii) the third and fifth harmonics, and/or (iii) the third, fifth and seventh harmonics, depending on the complexity of the applied harmonic rejection. Generally, the higher the harmonic to be suppressed, the more complex the modulator and the local oscillator (or clock) circuit is. HR techniques also require the input signal to be multiplied with copies of the local oscillator signal having different delays (phase) and weights (amplitude).

By properly choosing delays and weights, the summation of the mixer's outputs cancels the harmonics caused by the local oscillator signal. But the HR technique is not applicable for devices operating at millimeter-wave frequencies, where power consumption, area, and circuit complexity are of high importance, as the complexity of the systems employing HR grows exponentially with the number of harmonics to be cancelled.

In paper "A 79 GHz SiGe-Bipolar Spread-Spectrum TX for Automotive Radar" (S. Trotta et al, IEEE Solid-State Circuits Conference, 2007, pp. 430-613, 11-15 Feb. 2007), Trotta et al propose a bi-phase modulator utilizing a Gilbert-cell mixer for short-range automotive radar applications in the 79 GHz band, with the local oscillator signal being applied at the linear (transconductance) input of the mixer. But the architecture suffers from high-side lobes and fails to comply with emission regulations.

In "Sinusoidal SBPSK Modulation Waveform for UHF SATCOM Channels with Improved Adjacent Channel Emissions" (M. A. Belkerdid et al, IEEE Military Communications Conference, pp. 1-7, 29-31 Oct. 2007), Belkerdid et al propose a method for reducing the side-lobes in BPSK modulation by splitting the baseband binary signal to I and Q signals and applying non-linear phase shaping to I and Q signals prior to their modulation. This results in a modulated carrier with a sinusoidal phase transition from 0 to ±180 degrees over a time interval less than the bit period.

SUMMARY

The present disclosure provides a modulation circuit for radio devices operating at millimeter-wave frequencies and, more specifically, to a modulation circuit for BPSK modulation.

The present disclosure relates to a modulation circuit. According to one embodiment, the circuit is configured to: receive a digital baseband signal and feed the digital baseband signal to a first and a second signal path, the first signal path comprising a first mixer, the second signal path comprising a delay circuit and a second mixer, the first mixer and the second mixer each receiving a local oscillator signal, and respectively providing a first radio-frequency signal and a second radio-frequency signal that are delayed with respect to each other; and generate a radio-frequency signal by combining the first and second radio-frequency signals.

In one embodiment, the delay circuit provides a delay of one third of a bit period of the digital baseband signal. In another embodiment, each signal path further comprises a filter. In one such embodiment, each filter comprises a passive low-pass filter. For example, an RC filter may be implemented in a passive form, which is generally more linear and less noisy than an implementation in an active form.

In still another embodiment, the first mixer and the second mixer are configured to receive a first filtered signal and a second filtered baseband signal, respectively, at a respective non-linear input, and to receive the local oscillator signal at its linear input. In an additional embodiment, the first and the second mixer are passive mixer.

In a further embodiment, the circuit is configured to perform BPSK modulation.

In another embodiment, the circuit is configured to operate at millimeter-wave frequencies.

Advantageously, according to some embodiments, it is possible to attenuate the amplitude of side lobes in a modulated radio-frequency signal caused by high-frequency content in the baseband signal while keeping the maximum possible power of the modulated signal within the allowed band with minimal hardware and power overhead. Spectral emission within the allowed bandwidth is reduced sufficiently and complies with the emission regulations. When HR is applied at the baseband, there may not be an increase in circuit complexity in the local oscillator path. Further, complex hardware, such as an I mixer and a Q mixer for each signal path, and/or complex baseband or RF filters are not required. The digital baseband signal is applied to two signal paths, which are essentially the same with the exception of the delayed baseband signal in one signal path. According to one embodiment, by applying a harmonic rejection only for the third harmonic—the highest and closest side lobe to the main lobe—the added complexity cost in the signal path is limited. In another embodiment, simple baseband filtering and a harmonic reduction at the baseband is achieved. As the energy of the harmonics lessens with their order, the rejection of the third harmonic and baseband filtering for reducing the side lobes sufficiently complies with emission regulations. The filtering at the baseband does not require higher-order filtering that is power hungry for devices operating in the Gb/s range.

The present disclosure also relates to a modulation method comprising: receiving a digital baseband signal; mixing the digital baseband signal with a local oscillator signal thereby generating a first radio-frequency signal; delaying and mixing the digital baseband signal with the local oscillator signal thereby generating a second radio-frequency signal; and generating a radio-frequency signal by combining the first and second radio-frequency signals.

In one embodiment, the method further comprising filtering the digital baseband signal before mixing with the local oscillator signal.

Furthermore, the present disclosure relates to a radio device and a network system comprising a modulation circuit according to the present disclosure.

DETAILED DESCRIPTION

Figure 1:
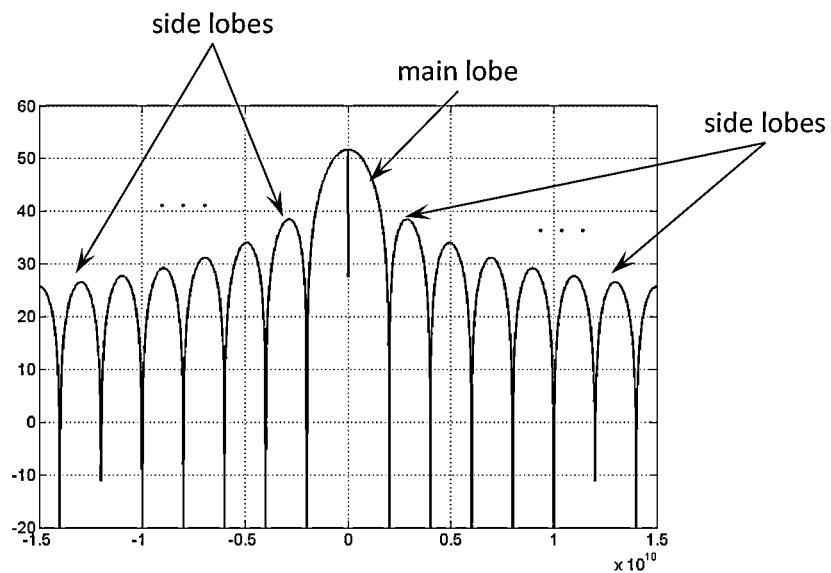
FIG. 1 illustrates one example of a BPSK spectrum.
Figure 2:
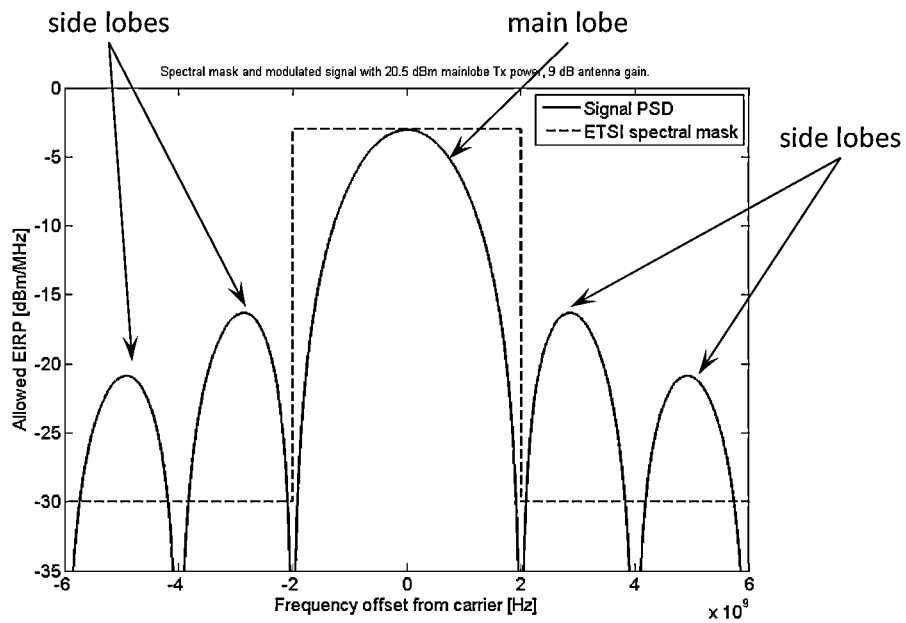
FIG. 2 illustrates another example of a BPSK spectrum with an indicated ETSI spectral mask.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third, and the like in the description and in the claims, are used for distinguishing between similar elements and not necessarily for describing a sequential or chronological order. The terms are interchangeable under appropriate circumstances, and the embodiments of the disclosure can operate in other sequences than described or illustrated herein.

Moreover, the terms top, bottom, over, under, and the like in the description and the claims are used for descriptive purposes and not necessarily for describing relative positions. The terms so used are interchangeable under appropriate circumstances, and the embodiments of the disclosure described herein can operate in other orientations than described or illustrated herein.

The term "comprising," as used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

The present disclosure advantageously provides harmonic rejection (HR) at baseband for the suppression of the spectrum occupancy of a modulated RF signal. Conventional HR techniques are not applied for devices operating at millimeter-wave frequencies due to their complexity and power consumption. According to the present disclosure, however, the resulting harmonic content in the modulated signal is not due to the harmonics of the oscillator signal but to the wide spectrum of the baseband signal, which is a digital signal. The harmonics of the baseband digital signal, which appear in the form of side lobes in the modulated radio-frequency signal as previously described, are of a great concern for the spectral emission of devices operating at millimeter-wave frequencies. The present disclosure applies the harmonic rejection concept to a baseband signal (e.g., a binary sequence) rather than to a local oscillator signal, as in conventional HR techniques, leading to the suppression of the harmonics (side lobes) caused by the baseband signal in the modulated RF signal.

Figure 3:
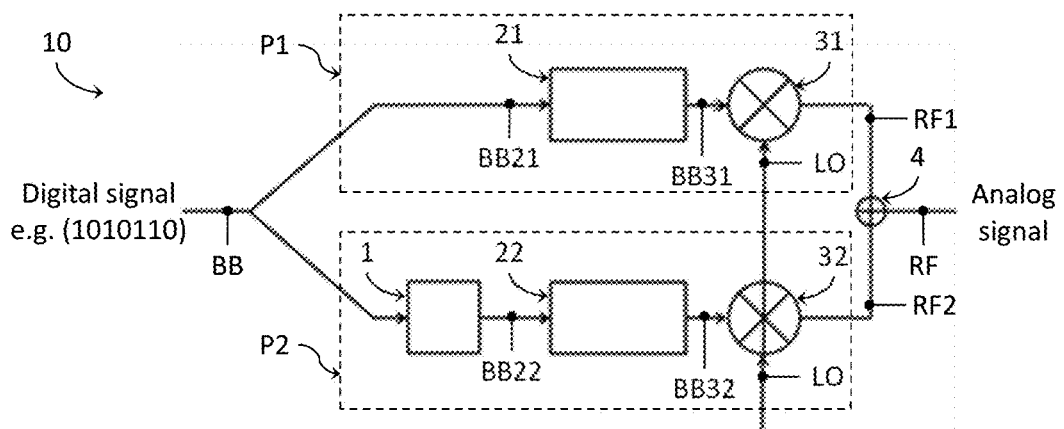
FIG. 3 illustrates a block diagram of a modulation circuit according to an example.
Figure 4:
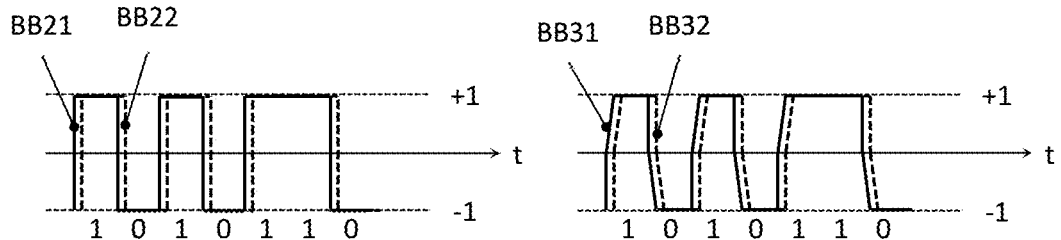
FIG. 4 illustrates a first baseband signal and a second baseband signal at each of an input of a baseband filter and at an input of mixers, according to an example.

According to one embodiment, a modulation circuit 10 is arranged for suppressing energy content of the spectral components outside an intended operational bandwidth of a modulated radio-frequency signal RF, as shown in FIG. 3. The modulation circuit 10 uses harmonic rejection to the baseband signal. A digital baseband signal BB is applied to each of first signal path P1 and a second signal path P2. A delay is applied to the baseband signal BB in the second signal path such that a first baseband signal BB21 in the first path and a delayed baseband signal BB22 will have phases that are rotated with respect to each other, as shown in FIG. 4. To suppress the high energy of the side lobes in a modulated radio-frequency signal due to high-frequency components in the baseband signal BB, the first and second baseband signals BB21 and BB22 may be up-converted by a first mixer 31 and a second mixer 32, respectively (note in example in which the modulation circuit 10 does not includes filters 21, 22 described below, the baseband signals BB21 and BB22 are equivalent to signals BB31 and BB32 shown in FIG. 3). The first mixer 31 and the second mixer 32 may thus provide a first radio-frequency signal RF1 and a second radio-frequency signal RF2 (i.e., up-converted baseband signals), respectively. An adder circuit 4 may then combine the first and second radio-frequency signals RF1, RF2 to generate a modulated output radio-frequency signal RF. By combining two up-converted signals that are the same expect for a difference in phase (e.g., the first and second radio-frequency signals RF1 and RF2), the modulation circuit 10 may substantially reduce or eliminate one or more harmonics in the resulting output radio-frequency signal RF.

To further reduce the high-frequency content in the baseband signals BB21, BB22, the first and second baseband signals BB21, BB22 may be filtered prior to up-conversion by a first filter 21 and second filter 22, respectively. As a result, a first filtered baseband signal BB31 and a second filtered baseband signal BB32 may be created, and the filtered baseband signals BB31 and BB32 may be fed to the respective mixer 31, 32 and up-converted with the same local oscillator signal LO. As in the previous examples, the two modulated (e.g., up-converted) radio-frequency signals RF1, RF2 may be generated, each having a phase rotated with respect to the other. The modulated radio-frequency signals RF1, RF2 are then combined in the adder circuit 4 to produce the modulated output radio-frequency signal RF. The applied baseband signal filtering may further reduce the side lobes in the output radio-frequency signal RF such that the energy of the side lobes is within the emission regulation.

FIG. 4 shows the respective baseband signal in each signal path before and after filtering. Before filtering, the baseband signals BB21 and BB22 are delayed with respect to each other. After filtering, the filtered baseband signals BB31, BB32 are smoothed—the waveform of the signals transitions from +1 to −1 and vice versa in a smoother manner.

Figure 5A:
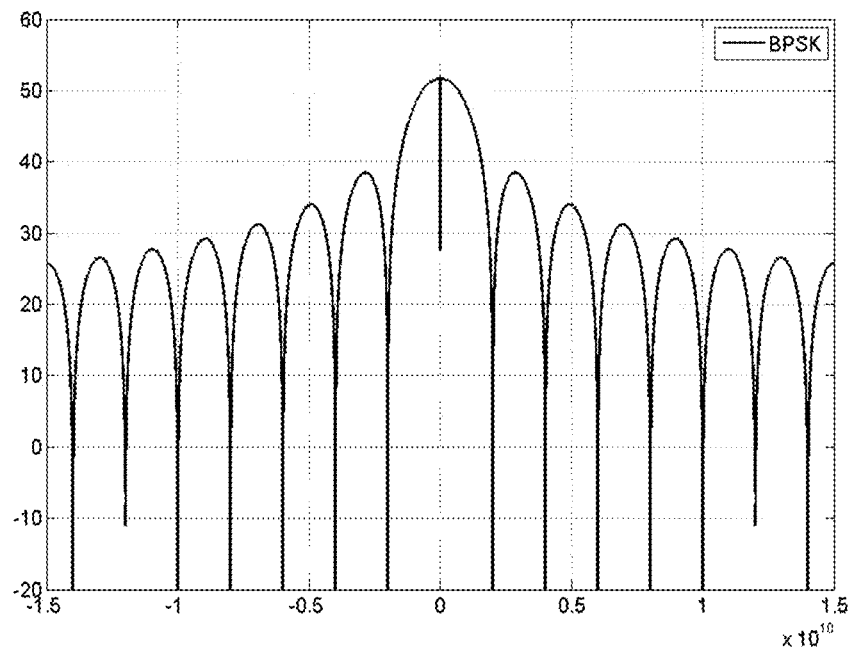
FIG. 5A illustrates a spectrum of a pure BPSK signal, according to an example.
Figure 5B:
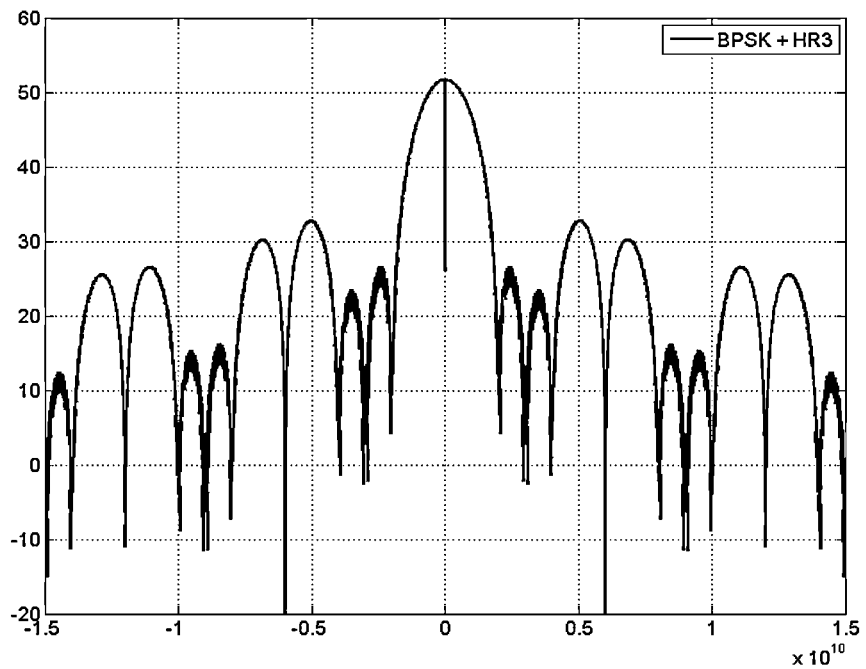
FIG. 5B illustrates a spectrum of a BPSK signal with harmonic rejection to a baseband signal, according to an example.
Figure 5C:
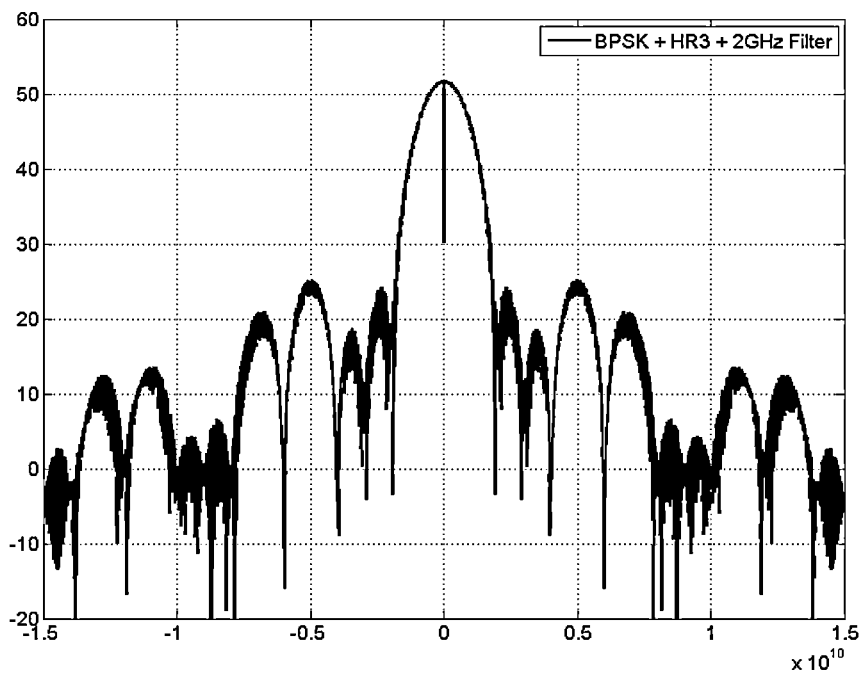
FIG. 5C illustrates a spectrum of a BPSK signal with harmonic rejection to a baseband signal with baseband signal filtering, according to an example.
Figure 6:
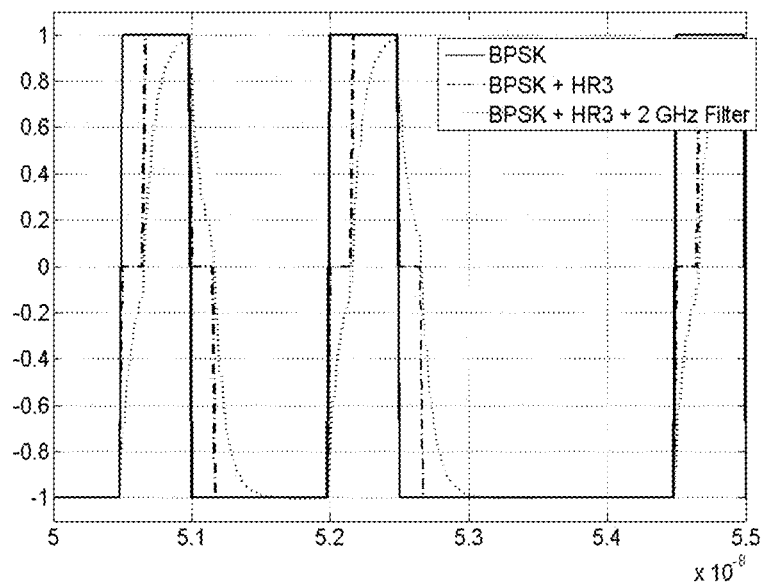
FIG. 6 illustrates waveforms of the BPSK signals shown in FIGS. 5A, 5B, and 5C, respectively.

FIG. 5 shows, respectively, an example of a BPSK spectrum for pure BPSK modulation, a BPSK modulation with third harmonic rejection, and a BPSK modulation with third harmonic rejection and baseband filtering. In comparison to a pure BPSK signal shown in FIG. 5A, applying third harmonic rejection to the baseband signal significantly suppresses the side lobes while preserving the energy of the main lobe (see FIG. 5B). In addition, the side lobes corresponding to the (n*3)th harmonic are also suppressed. Such harmonic rejection results in suppression of the energy content of the side lobes in the spectrum of the baseband signal, as opposed to the local oscillator as in conventional harmonic rejection solutions. To comply with the emission regulation, additionally baseband filtering may be applied with harmonic rejection as shown in FIG. 5C. FIG. 6 shows a resulting modulated signal for the three different modulation schemes shown in FIG. 5. It is noticeable that the application of harmonic rejection to the baseband signal smooths the transition edges in the modulated signal to a staircase waveform of the phase transition from 0 to 180 degrees and vice versa. In combination with the baseband filtering (i.e. 2 GHz filter, a LPF filter with a cut-off frequency at 2 GHz), the staircase waveform is further smoothed, which results in further lowering the energy content in the spectrum of the modulated radio signal RF.

In another example, the delay circuit 1 delays the baseband signal BB with a delay of one-third the bit period of the baseband signal BB. Thus, the baseband signals BB21, BB22 in the two signal paths P1, P2 are delayed with respect to each other, having phases rotated over 0 and 120 degrees, respectively. Delaying the baseband signal BB in the second signal path P2 with one-third of the bit period may achieve an optimal result with respect to canceling the third harmonic in the modulated radio-frequency signal RF. Thus, the third harmonic caused by the high-frequency content of the baseband signal BB and corresponding to the first side lobe—the highest and the closest side lobe to the main lobe—in the frequency spectrum of the RF signal is removed. However, the skilled person will recognize that delaying the baseband signal BB with a bigger or a smaller than one-third of the bit period delay is also beneficial. In this case, the $3^{rd}$ harmonic will not be completely removed. To comply with the emission regulation, however, additional side lobes' suppression may be achieved by applying baseband filtering as according to the present disclosure.

Figure 7:
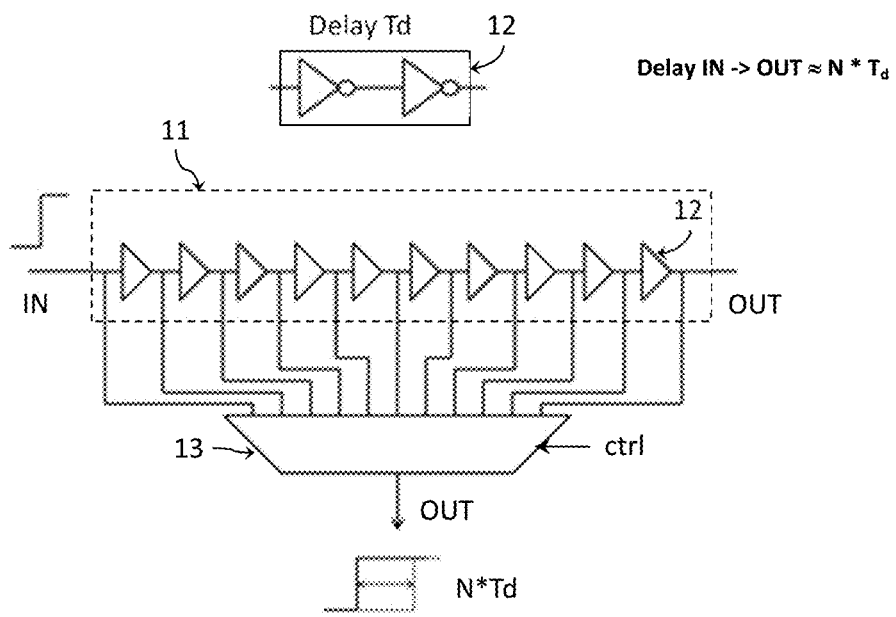
FIG. 7 illustrates a delay circuit, according to an example.

An example implementation of the delay circuit 1 arranged for receiving a digital signal IN and for outputting a delayed digital signal OUT is shown in FIG. 7. In CMOS technology, the delay circuit 1 may be implemented as a chain of delay cells 11, which input IN is fed with the digital baseband signal BB. Each delay cell 12 comprises of two inverters connected in series as shown on top of the figure. The signal at the output of a delay cell 12 is thus a non-inverted copy of the input signal IN delayed with a unit delay $T_d$. The unit delay $T_d$ defines the accuracy (or precision) with which the amount of delay can be tuned to a specified value. The unit delay $T_d$ depends on the technology. For a scaled CMOS technology as 40 nm or 28 nm, the unit delay $T_d$ may be less than 20 ps. The amount of delay to be added to the digital signal may be controlled with a multiplexor 13 as follows. Each input of the multiplexer 13 receives a signal from the output of each respective delay cell 12. The number of delay cells 12 in the chain 11 defines the total amount of delay T introduced to the digital signal. For example, the digital signal at the output of the Nth delay cell is delayed with $T=N*T_d$. By controlling which signal at the input of the multiplexor 13 is passed to its output, a specific delayed version of the digital signal may be selected. According to a control signal ctrl, the multiplexor 13 selects an appropriate input signal to provide a signal rotated over 120 degrees.

Another possible way to control the amount of delay added to the digital signal would be to use a delay locked loop (DLL). In this case, the delay circuit may be implemented as a cascade of 3*k delay cells, where k is a positive integer. The delay can be tuned close to the desired value by locking the total delay to the Bit Rate (clock frequency). In a locking condition each group of k delay cells will have a delay of ⅓ of the bit period.

Figure 8:
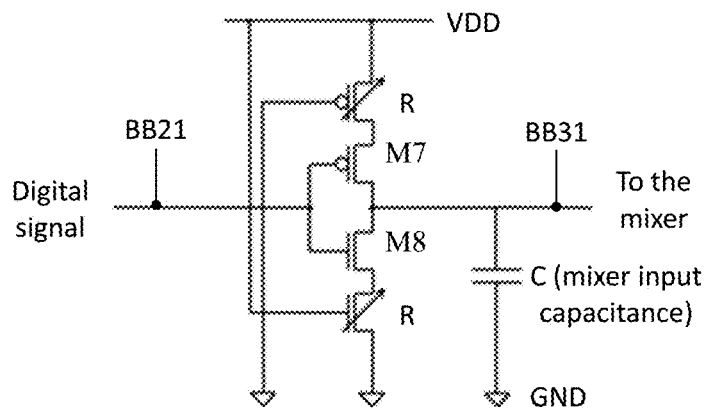
FIG. 8 illustrates a low-pass filter, according to an example.

In another embodiment, the filters 21, 22 may include passive low-pass filters (RC filters). Implementing the filters 21, 22 in a passive form leads to a more linear and less noisy filter implementation than for active filters. FIG. 8 shows an example implementation of a passive low-pass filter implemented in CMOS. In this case, the filter may be embedded in a driver circuit that controls the switches of the mixer (its non-linear input). The resistors R provides degenerative resistance and connects the inverter pair (M7, M8) to VDD and GND, respectively. As a filter capacitance C, the mixer's input capacitance is used. The low-pass filters 21, 22 may be tuneable filters. Tuning may be needed, for example, to adjust a pole of the filter and place it in the desired position over process corners. In one such example, the resistors R may be implemented as an array of parallel PMOS and/or an array of parallel NMOS transistors. By switching on or off transistors in each respective resistive array, the effective resistance R, and respectively the degenerative resistance of the filter is changed. A control circuit, e.g. the baseband processor, may be used for the tuning of the degenerative resistance for a desired bandwidth.

Figure 9:
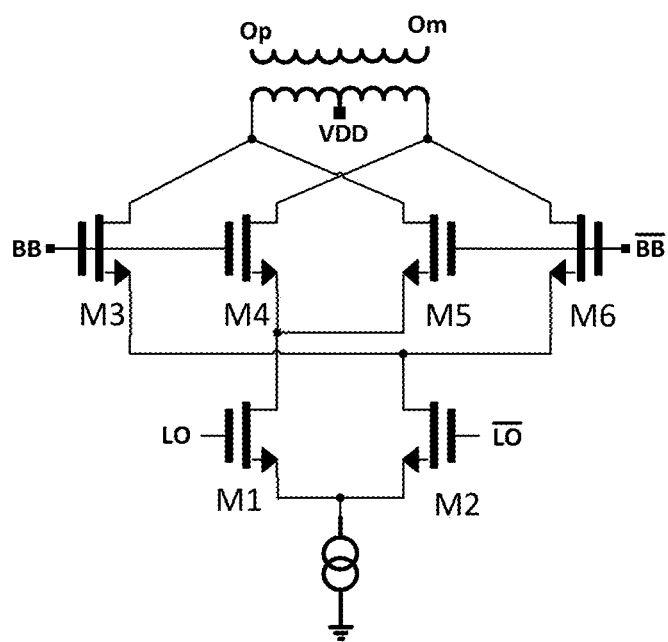
FIG. 9 illustrates a Gilbert-cell mixer, according to an example.

In a further example, as shown in FIG. 9, each mixer 31, 32 may be implemented as a passive mixer with an LC resonant load placed at terminals Op and Om. In this example, the baseband signal BB is applied at the non-linear (transconductance) input, e.g., the input of transistors M3, M4, M5, and M6, and the local oscillator LO signal is applied at the linear (switching) input of the mixer—at the input of transistors M1 and M2. By feeding the local oscillator signal LO, $\overline{LO}$ to the mixer's linear input, e.g., the input of transistors M1 and M2, a local oscillator signal with a small amplitude may be used. The power efficiency of the mixer itself and the local oscillator path is increased, as the need of additional buffering circuitry for amplifying the local oscillator signal (which increases with the increase in an operation frequency) to switch the mixer is avoided. This is beneficial because, for a local oscillator frequency approaching a cut-off frequency of the transistors and in a low voltage supply technology like CMOS, achieving very high swings requires the usage of inductors with high quality factors and is very power hungry. Preferably, the mixer 31, 32 may be implemented as a Gilbert-cell mixer.

By introducing a filter at the switching input of each respective mixer, the transistors M3-M6 are not acting like ideal switches being alternatively switched on and off. This means there may be fractions of time in which both the transistors M3 and M6 (and/or M4 and M5) are on. This may slightly affect output noise and linearity with respect to the other mixer's input. However, for a radio device operating at millimeter-wave frequencies, a higher noise figure and lower linearity is tolerable.

In some examples, the modulation circuit 10 is arranged for performing BPSK modulation. Further, the modulation circuit 10 may be particularly suitable for operating at millimeter-wave frequencies. More specifically, the modulation circuit 10 may be suitable for 79 GHz radar applications.

Figure 10:
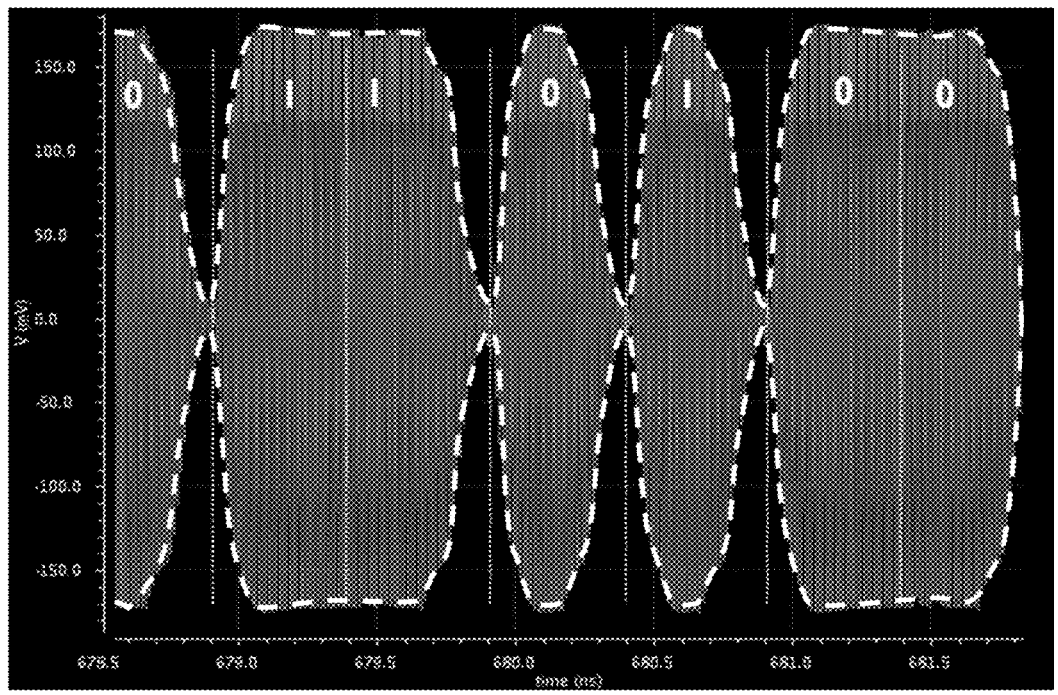
FIG. 10 illustrates a modulated BPSK signal generated by a modulation circuit, according to an example.
Figure 11:
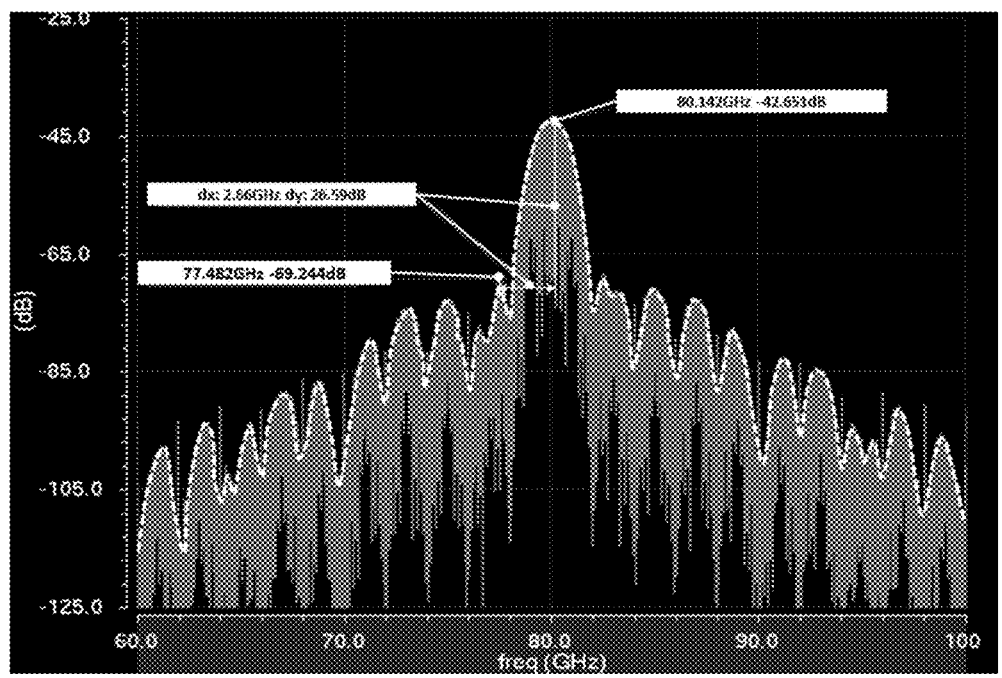
FIG. 11 illustrates a spectrum of a modulated BPSK signal shown in FIG. 10.

Simulations using the modulation circuit 10 (as implemented with Gilbert-cell mixers having an LC resonator tank with a quality factor of about 5) using a carrier frequency of 83 GHz with a pseudo-random baseband digital sequence (0110100) at a 2 Gps rate, were performed to demonstrate the efficiency of the modulation circuit 10. The simulations results were done in Cadence MMSIM for a 28 nm CMOS implementation. FIG. 10 shows the modulated signal at the output of the modulation circuit 10. Differently from an ideal BPSK, the modulated signal herein has a smooth phase transition from 0 to 180 degrees and vice versa. This smooth phase transition in the time-domain signal is equivalent to a reduction of the spectral side lobe in the frequency domain. FIG. 11 shows the frequency spectrum of the modulated signal of FIG. 10, where it is clearly shown that the side lobes were suppressed and that the signal is compliant with the emission standards and regulations. For example, the power of the main lobe, located at 80.14 GHz, is maintained close to its maximum −42.65 dBm, while for example the closest side lobe on the left, located at 77.46 GHz, has a power of −69.24 dBm, which is 26 dBm lower than the power of the main lobe.

The present disclosure also relates to a method for suppressing energy content of spectral side lobes outside an intended operational bandwidth in a modulated radio-frequency signal. As explained previously, the spectral side lobes in the modulated signal are due to high-frequency content present in the baseband signal. The proposed method uses a harmonic rejection to the baseband signal, and is thus described with respect to FIG. 3. The method may include receiving a digital baseband signal BB and generating a radio-frequency signal RF with suppressed energy of spectral side lobes while maintaining the energy of the main lobe.

The digital baseband signal BB may be applied to two signal paths P1, P2, and the baseband signal BB may be up-converted to a radio frequency. The implementation of the two signal paths P1, P2 are essentially kept the same, with the difference being that the baseband signal BB in the second signal path P2 is delayed. In the first signal path P1, the baseband signal BB is up-converted (or mixed) by a first mixer 31 with a local oscillator signal LO to generate a first radio-frequency signal RF1. In the second signal path P2, however, the baseband signal BB is first delayed by the delay circuit 1 and then mixed with the same local oscillator signal LO in mixer 32 to generate a second radio-frequency signal RF2. Two modulated radio-frequency signals RF1, RF2 delayed with respect to each other may thus be obtained. The radio signals RF1, RF2 may then be combined to form the radio-frequency signal RF.

In one example, the baseband signal BB21, BB22 may be filtered before up-conversion. In this example, the baseband signal BB21 in the first signal path P1 may first be filtered by a first filter 21 and then mixed with the local oscillator signal LO to generate the first radio-frequency signal RF1. In the second signal path P2, the baseband signal BB may first be delayed, and then filtered by a second filter 22 and mixed with the same local oscillator signal LO to generate the second radio-frequency signal RF2. Similarly, the two signal RF1, RF2 may then be combined to form the radio-frequency signal RF.

Furthermore, the present disclosure relates to a radio device and to a network system comprising a circuit 10 as described in any of the previous examples.

What is claimed is:

1. A circuit comprising:
a first signal path comprising a first mixer, wherein the first mixer is configured to modulate a baseband signal with a local oscillator signal to provide a first radio-frequency signal, wherein the first mixer is configured to receive (i) the baseband signal at a non-linear input and (ii) the local oscillator signal at a linear input;
a second signal path comprising a delay circuit and a second mixer, wherein the delay circuit is configured to delay the baseband signal by a delay time, and wherein the second mixer is configured to modulate the delayed baseband signal with the local oscillator signal to provide a second radio-frequency signal, wherein the second mixer is further configured to receive (i) the delayed baseband signal at a non-linear input and (ii) the local oscillator signal at a linear input; and
an adder circuit configured to combine the first radio-frequency signal and the second radio-frequency signal to provide an output radio-frequency signal.

2. The circuit of claim 1, wherein the delay time is one-third of a bit period of the baseband signal.

3. The circuit of claim 1, wherein the first signal path comprising a first filter upstream of the first mixer, and wherein the second signal path comprises a second filter between the delay circuit and the second mixer, wherein each of the first filter and the second filter comprises a passive low-pass filter.

4. The circuit of claim 3, wherein the passive low-pass filter has a cut-off frequency of 2 GHz.

5. The circuit of claim 1, wherein each of the first mixer and the second mixer comprises a passive mixer.

6. The circuit of claim 1, wherein the at least one millimeter-wave frequency signal comprises a frequency above 2 GHz.

7. The circuit of claim 1, wherein the circuit is arranged to output a binary phase-shift keying modulated radio-frequency signal.

8. A method comprising:
receiving at a modulation circuit a digital baseband signal;
mixing the digital baseband signal with a local oscillator signal to generate a first radio-frequency signal, wherein mixing the digital baseband signal comprises receiving: (i) the baseband signal at a non-linear input and (ii) the local oscillator signal at a linear input;
delaying the digital baseband signal to provide a delayed baseband signal;
mixing the delayed baseband signal with the local oscillator signal to generate a second radio-frequency signal, wherein mixing the delayed baseband signal comprises receiving (i) the delayed baseband signal at a non-linear input and (ii) the local oscillator signal at a linear input; and
generating an output radio-frequency signal by combining the first radio-frequency signal and the second radio-frequency signal.

9. The method of claim 8, further comprising filtering the digital baseband signal before mixing the digital baseband signal with the local oscillator signal and filtering the delayed baseband signal before mixing the delayed baseband signal with the local oscillator signal.

10. The method of claim 9, wherein filtering the delayed baseband signal comprises filtering the delayed baseband signal with a passive low pass filter having a cut-off frequency of 2 GHz.

11. The method of claim 8, wherein the delay time is one-third of a bit period of the digital baseband signal.

12. The method of claim 8, wherein mixing the digital baseband signal with the local oscillator signal and mixing the delayed baseband signal with the local oscillator signal are performed with respective passive mixers.

13. The method of claim 8, wherein at least one millimeter-wave frequency signal comprises a frequency above 2 GHz.

14. The method of claim 8, wherein the output radio-frequency signal comprises a binary phase-shift keying modulated radio-frequency signal.

15. A radio device comprising a modulation circuit, the modulation circuit comprising:
a first signal path comprising a first mixer, wherein the first mixer is configured to modulate a baseband signal with a local oscillator signal to provide a first radio-frequency signal, wherein the first mixer is configured to receive (i)

the baseband signal at a non-linear input and (ii) the local oscillator signal at a linear input;

a second signal path comprising a delay circuit and a second mixer, wherein the delay circuit is configured to delay the baseband signal by a delay time, and wherein the second mixer is configured to modulate the delayed baseband signal with the local oscillator signal to provide a second radio-frequency signal; and an adder circuit configured to combine the first radio-frequency signal and the second radio-frequency signal to provide an output radio-frequency signal.

16. The radio device of claim 15, wherein the delay time is one-third of a bit period of the baseband signal.

17. The radio device of claim 15, wherein each of the first mixer and the second mixer comprises a passive mixer.

18. The radio device of claim 15, wherein the output radio-frequency signal comprises a frequency above 2 GHz.

19. The radio device of claim 15, wherein the circuit is arranged to output a binary phase-shift keying modulated radio-frequency signal.

* * * * *